(12) United States Patent
Bianchi et al.

(10) Patent No.: US 11,733,282 B2
(45) Date of Patent: *Aug. 22, 2023

(54) PROBE FOR NON-INTRUSIVELY DETECTING IMPERFECTIONS IN A TEST OBJECT

(71) Applicant: AIRBUS HELICOPTERS, Marignane (FR)

(72) Inventors: Laurent Bianchi, Marseilles (FR); Sebastien Bernier, Pertuis (FR); John Enderby, Bristol (GB); Mark Bowes, Carmarthenshire (GB); Dawood Parker, Whitland (GB)

(73) Assignee: AIRBUS HELICOPTERS, Marignane (FR)

( * ) Notice: Subject to any disclaimer, the term of this patent is extended or adjusted under 35 U.S.C. 154(b) by 0 days.

This patent is subject to a terminal disclaimer.

(21) Appl. No.: 17/751,721

(22) Filed: May 24, 2022

(65) Prior Publication Data
US 2022/0291269 A1 Sep. 15, 2022

Related U.S. Application Data

(63) Continuation of application No. 16/199,809, filed on Nov. 26, 2018, now Pat. No. 11,366,150.

(30) Foreign Application Priority Data

Dec. 5, 2017 (EP) .................................. 17315008

(51) Int. Cl.
*G01R 29/08* (2006.01)
*G01R 31/00* (2006.01)
(Continued)

(52) U.S. Cl.
CPC ......... *G01R 29/0878* (2013.01); *G01N 27/24* (2013.01); *G01R 1/07* (2013.01); *G01R 31/002* (2013.01)

(58) Field of Classification Search
CPC ...... G01N 27/24; G01R 1/07; G01R 29/0878; G01R 31/002
See application file for complete search history.

(56) References Cited

U.S. PATENT DOCUMENTS 5,426,373 A 6/1995 Diamond et al.
6,249,130 B1 6/2001 Greer
(Continued)

FOREIGN PATENT DOCUMENTS

CN 204462065 U 7/2015
EP 0527854 B1 10/1994

OTHER PUBLICATIONS

Xiaohui Hu et al.: "Planar capacitive sensors—designs and applications", Sensor Review, vol. 30, No. 1, Jan. 26, 2010, pp. 24-39, XP055473609, United Kingdom, 16 pages.
(Continued)

*Primary Examiner* — Son T Le
*Assistant Examiner* — Adam S Clarke
(74) *Attorney, Agent, or Firm* — Brooks Kushman P.C.

(57) ABSTRACT

A probe for non-intrusively detecting imperfections in a test object made from metallic, non-conductive, and/or composite materials. The probe may include a capacitive measuring apparatus that includes at least two coplanar electrodes, an adjustment device to adjust a spatial separation between the electrodes, and a separation device. The separation device may maintain a substantially constant distance between the at least two coplanar electrodes and the test object during test measurements.

20 Claims, 9 Drawing Sheets

(51) Int. Cl.
*G01R 1/07* (2006.01)
*G01N 27/24* (2006.01)

(56) References Cited

U.S. PATENT DOCUMENTS

| | | | |
|---|---|---|---|
| 6,486,673 B1 * | 11/2002 | Goldfine | G01V 3/088 |
| | | | 324/688 |
| 8,452,565 B2 | 5/2013 | Zelder | |
| 8,760,184 B2 | 6/2014 | Zelder et al. | |
| 2002/0057096 A1 | 5/2002 | Muller et al. | |
| 2002/0175691 A1 | 11/2002 | Sovik et al. | |
| 2003/0080744 A1 | 5/2003 | Goldfine et al. | |
| 2005/0082032 A1 | 4/2005 | Goldfine et al. | |
| 2005/0171703 A1 * | 8/2005 | Goldfine | G01N 27/9013 |
| | | | 702/30 |
| 2007/0214623 A1 | 9/2007 | Lee et al. | |
| 2015/0168891 A1 | 6/2015 | Van Herpen et al. | |
| 2015/0226579 A1 | 8/2015 | Nino et al. | |

OTHER PUBLICATIONS

European Search Report for Application No. 17315008.7, Completed by the European Patent Office, dated May 9, 2018, 9 pages.

* cited by examiner

PROBE FOR NON-INTRUSIVELY DETECTING IMPERFECTIONS IN A TEST OBJECT

CROSS-REFERENCE TO RELATED APPLICATIONS

This application is a continuation of U.S. application Ser. No. 16/199,809 filed Nov. 26, 2018, which claims priority to European patent application No. EP 17315008.7 filed on Dec. 5, 2017, the disclosures of which are incorporated in their entireties by reference herein.

TECHNICAL FIELD

The invention is related to the detection of imperfections in metals, non-conductors, and composite materials, and, more particularly, to a probe that includes a capacitive measuring apparatus for non-intrusively detecting imperfections in a test object made from metallic, non-conductive, and/or composite materials.

BACKGROUND

Safety-critical structural components made from metals, non-conducting materials, and/or composite materials are found in many places, such as high-rise buildings, hazardous material storage and transportation containers, petrochemical processing plants, nuclear power plants, aircrafts, spacecrafts, motor vehicles, construction machinery, just to name a few. Such safety-critical structural components often have predetermined fail-safe characteristics, and the likelihood for the occurrence of failure increases dramatically if imperfections such as delamination and/or porosities in composite materials or corrosion in metals, are present. Therefore, there is a need to test these materials in order to detect imperfections, preferably by performing non-destructive testing (NDT).

Currently, several different non-destructive inspection methods are able to detect imperfections in test objects. Some of the existing non-destructive inspection methods to detect imperfections in test objects made from composite materials include ultrasonic pulse echo inspection, tap-test inspection, x-ray examination, thermography, and shearography. Eddy current testing is a widely used method to detect imperfections in test objects made from metallic materials.

Eddy current testing (ECT) is one of many non-destructive electromagnetic testing methods used to detect and characterize surface and sub-surface flaws in test objects made from conductive materials. Eddy current testing can detect tight cracks and is very sensitive to detect and size pits. Corrosion can be detected as well, but sizing is usually not accurate and often only detected at an advanced stage.

Ultrasonic pulse echo inspection is often used for detecting imperfections in test objects made from composite materials. In a composite material, an ultrasonic sound wave will travel through the material until it reaches an air boundary. In normal conditions this air boundary will be the opposite surface of the composite. When the composite material has an imperfection such as an unwanted thinning of the composite material or an air inclusion inside the composite material, caused for example by delamination of the structure, the echo will come from that imperfection. The difference in echo time is used to distinguish an undamaged from a damaged test object.

Tap-test inspection is done with a hand-held device which usually consists of a hammer. The basic principle consists of tapping with the hand-held device at different areas of the test object. An area with an underlying imperfection produces a different sound (i.e., resonance frequency) than an area that is free of imperfections due to a difference in stiffness. However, this method is limited in terms of the thickness of the test object and provides very limited information on the type and exact location of the imperfection.

X-ray examination sends low-energy x-rays through the test object which are captured by an x-ray sensitive film that is placed under the test object. Analyzing discolorations of the film can be used to detect flaws in the test object such as a crushed core or to detect water in the core cells. However, x-ray examination is not suitable for detecting air inclusions, and x-rays can only be used by staff adequately protected from the harmful effects of x-rays.

The thermography inspection method uses an external heat source to heat up the test object. Because of the low thermal conductivity and, therefore, low heat flow through composite materials, the heat distribution pattern can be used for damage detection in test objects made from such materials. Thermography is especially well-suited to detect water accumulation in composite sandwich panels of larger surfaces.

Shearography or Speckle pattern shearing interferometry is an optical method for detecting imperfections in different materials. A first optical image is obtained of the test object without any load on it. A second optical image is created by "shearing" the first optical image, and a superposition of the first and second images leads to a shear image. A small load is then applied to the test object and a third image is obtained, whereby a non-uniform test object generates a non-uniform movement of the surface of the test object. Software compares the shear image with the third image to detect imperfections in the test object. However, while this method has some application in detecting damage in honeycomb sandwich composite structures, it cannot detect delamination.

The document EP 0 527 854 B1 describes a device for non-destructive thickness measurements of dry paint film applied to a plastic non-metallic substrate. The device includes two separate electrodes that are isolated from each other and positioned in a material capable of conforming to the surface of the film that is being measured. However, use of the device is limited to measuring the dry paint film thickness of a paint applied by conventional or electrostatic spraying to a plastic substrate primed with a conductive primer.

The document U.S. Pat. No. 8,452,565 B2 describes a method for calibrating a high frequency measurement device for determining scattering parameters of a measurement object (device under test, DUT). In particular, a high frequency test signal is fed into an electrical lead that is connected to the measurement object (e.g., an electrical or electronic component) or to a circuit having the measurement object. The contactless coupling, for example capacitive, at three different coupling positions (i.e., sections) of the electrical lead is modeled by three ideal capacitors. Instead of capacitive coupling, it is also possible to use inductive couplings or mixed capacitive and inductive couplings, or any other type of coupling. The coupled-out voltages are determined at receivers in the form of measuring sites.

The document U.S. Pat. No. 8,760,184 B2 describes a measuring probe, particularly for a non-contacting vector network analysis system, having a housing and at least one coupling structure disposed on the housing and designed for coupling an RF signal from a signal line, such that at least one additional signal probe is disposed on the housing for coupling an electrical signal into the signal line. A typical application for such a measuring probe consists of testing an electrical or electronic circuit on a printed circuit board, when the circuit comprises an embedded electrical or electronic component to be tested (the DUT—device under test) and other electrical or electronic components.

SUMMARY

Based on the limitations and drawbacks of the prior art, an objective of the present invention is to provide a new probe for non-intrusively detecting imperfections in a test object, whereby the test object may be made from metallic, non-conductive, and/or composite materials. This new probe should provide a portable and easy-to-operate solution for the commercial non-destructive testing of test objects of any size and shape made from metallic, non-conductive, and/or composite materials. This objective is solved by a probe comprising the features of claim 1.

More specifically, according to the present invention, a probe for non-intrusively detecting imperfections in a test object made from metallic, non-conductive, and/or composite materials comprises a capacitive measuring apparatus. The capacitive measuring apparatus comprises at least two coplanar electrodes and a separation device. The separation device maintains a substantially constant distance between the at least two coplanar electrodes and the test object during test measurements.

According to one aspect, the probe may further include an adjustment device for adjusting a spatial separation between the at least two coplanar electrodes.

According to one aspect, the probe may further include at least two disks for non-intrusively detecting imperfections in test objects with a curved surface, whereby respective disks of the at least two disks form respective ones of the at least two coplanar electrodes.

Advantageously, the at least two disks are mounted parallel to each other on a roller.

According to one aspect, the probe further includes a spring-loaded contact that electrically couples a power source through the roller with at least one of the at least two disks.

According to one aspect, the separation device includes a coating of the at least two coplanar electrodes.

Advantageously, the coating is electrically insulating.

Advantageously, the coating is impervious to water.

According to one aspect, the coating includes at least one of parylene or polytetrafluoroethylene.

According to one aspect, the separation device includes an insulating substrate.

Advantageously, the insulating substrate forms a well that accommodates the at least two coplanar electrodes.

According to one aspect, the separation device further includes a distance measurement apparatus for measuring a distance between the at least two coplanar electrodes and the test object.

Advantageously, the distance measurement apparatus includes a device based at least on one of an optical or an acoustical interference method.

According to one aspect, the separation device further includes a distance adjustment apparatus for adjusting the substantially constant distance between the at least two coplanar electrodes and the test object based on the distance measured between the at least two coplanar electrodes and the test object with the distance measurement apparatus.

The present invention further provides a method for non-intrusively detecting imperfections in a test object using the probe and including the steps of measuring a capacitance at a predetermined position of the probe relative to the test object, determining a real part and an imaginary part of a complex dielectric constant based on the measured capacitance at the predetermined position, and comparing the real part and the imaginary part of the complex dielectric constant with the real part and the imaginary part of another capacitance determined using a reference object without imperfections to determine whether the test object has imperfections.

BRIEF DESCRIPTION OF THE DRAWINGS

Preferred embodiments of the invention are outlined by way of example in the following description with reference to the attached drawings. In these attached drawings, identical or identically functioning components and elements are labeled with identical reference numbers and characters and are, consequently, only described once in the following description.

DETAILED DESCRIPTION

Figure 1:
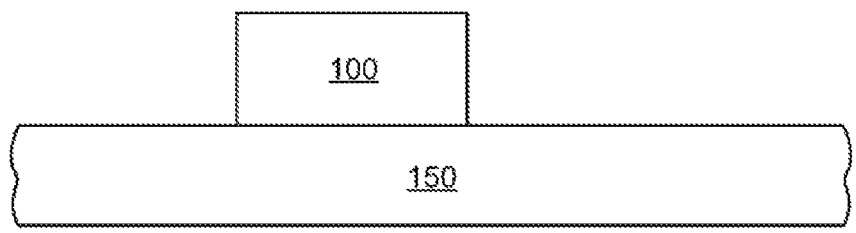
FIG. 1 is a diagram of an illustrative probe over a test object in accordance with some embodiments.

FIG. 1 shows a probe 100 over a test object 150. Test object 150 may be made from metallic, non-conductive, and/or composite materials. Test object 150 is shown as a planar surface with a uniform thickness. However, test object 150 may have any form and shape including a curved surface and/or a varying thickness. Test object 150 may include imperfections, which are sometimes also referred to as flaws or defects. For example, test object 150 may have inclusions of various type (e.g., air, water, metals, non-metals, etc.) and shapes (e.g., bubbles, crystals, etc.), material changes of state (e.g., burn, corrosion, etc.), or any other imperfection.

Probe 100 may detect imperfections in test object 150. If desired, probe 100 may include a capacitive measuring apparatus to measure a capacitance at a predetermined position of probe 100 relative to test object 150. Probe 100 may determine a complex dielectric constant based on the measured capacitance at the predetermined position. Probe 100 may determine whether the test object has imperfections by comparing the real and imaginary parts of the determined dielectric constant with the real and imaginary parts of another complex dielectric constant that was determined using a reference object without imperfections.

A complex dielectric constant derived from measuring the capacitance of test object 150 may be different than a dielectric constant determined using a reference object without imperfections of the same size and shape, and the difference in complex dielectric constants may be caused by imperfections. In fact, various materials or state of the matter may have different dielectric constants. For instance, air has a dielectric constant of one and is wholly real (i.e., the complex dielectric constant has no imaginary part). Metals have complex dielectric constants with real and imaginary parts that are frequency dependent. Most polymers have dielectric constants with a real part of about 6 and with relatively small imaginary parts. Water has a high dielectric constant of about 80, and is therefore relatively easy to detect.

According to one aspect, probe 100 may have two sensing electrodes and measure the electrical charge transferred between the two sensing electrodes when one is driven by an oscillating voltage. Probe 100 may derive the capacitance between the electrodes from the transferred electrical charge. The capacitance is a function of electrode area, separation, and effective dielectric constant of any intervening material such as test object 150.

If desired, the test object may be placed between electrodes for measuring the capacitance. In a preferred embodiment, probe 100 has coplanar electrodes (i.e., the electrodes lie in the same plane) and, thus, can be applied to test object 150 from one side only, instead of having to sandwich the material in between the electrodes. In fact, placing a test object of thickness t inside a capacitor with electrode area S and electrode separation d may have the same capacitance as placing the two electrodes on the same side of the test object at a distance d-t from the surface of the test object.

As an example, consider that the space between the electrodes and the test object is filled with air, which has a dielectric constant of $\varepsilon_0$ and that the test object has a complex dielectric constant, whereby $\varepsilon_1(\omega)$ and $\varepsilon_2(\omega)$ are the real and imaginary parts of the complex dielectric constant, $\omega$ is the angular frequency, and $\sigma$ is the electrical conductivity of the test object. In this scenario, the imaginary part of the complex dielectric constant can be expressed as $\varepsilon_2(\omega)=\sigma(\omega)/(\omega\varepsilon_0)$ and the capacitances of the test object $C_1$ and of the air gap $C_2$ as $$C_1 = S\varepsilon_0(\varepsilon_1(\omega) - i\varepsilon_2(\omega))/t \quad (1)$$

$$C_2 = S\varepsilon_0/(d-t) \quad (2)$$

Since $C_1$ and $C_2$ are coupled in series, the total capacitance of the air gap and the test object may be expressed as $$1/C = 1/C_1 + 1/C_2 \quad (3)$$

The impedance Z of the capacitor has real part $R_c$ and imaginary part $I_c$ and can be expressed as $$Z = R_c + i\, I_c = (i/(\omega C)) \quad (4)$$

With equations (1) to (4), the real and imaginary parts of Z can be determined as $$R_c = \varepsilon_2 t/(\omega^2 \varepsilon_0 S(\varepsilon_1^2 + \varepsilon_2^2)) \quad (5)$$

$$I_c = (-(d-t)(\varepsilon_1^2 + \varepsilon_2^2) + \varepsilon_1 t)/(\omega^2 \varepsilon_0 S(\varepsilon_1^2 + \varepsilon_2^2)) \quad (6)$$

Thus, measuring the impedance of the capacitor and using equations (5) and (6) may enable the determination of $\varepsilon_1(\omega)$ and $\varepsilon_2(\omega)$.

Figure 2:
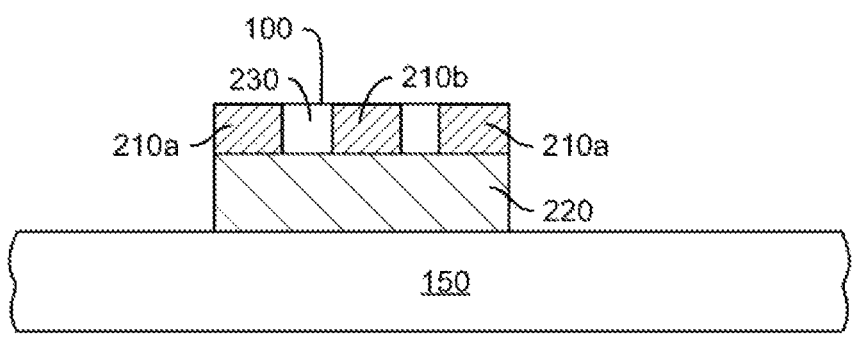
FIG. 2 is a diagram of the illustrative probe over the test object of FIG. 1, the probe having electrodes, an adjustment device, and a separation device in accordance with some embodiments.

FIG. 2 shows an embodiment of probe 100 over test object 150 with a capacitive measuring apparatus that has coplanar electrodes 210a, 210b, collectively also referred to as electrodes 210. As shown, the probe may further include separation device 220, and adjustment device 230.

Adjustment device 230 may adjust a spatial separation between the coplanar electrodes. Adjustment device 230 may take any form that allows the adjustment of the spatial separation between the coplanar electrodes. For example, adjustment device 230 may include a support device (e.g., an insulating plate made from polycarbonate). The support device may provide various positions at which electrodes 210 may be fixed (e.g., using a demountable screw system). The adjustment may include fixing the electrodes at positions that provide a different distance from each other. As another example, adjustment device 230 may include a rail or a groove. At least one of electrodes 210 may be attached to and movable along the rail (e.g., via an insulating support). Adjustment device 230 may move the movable electrodes along the rail, thereby adjusting the spatial separation between the electrodes.

Separation device 220 may maintain a substantially constant distance, which is sometimes also referred to as a "lift-off", between the coplanar electrodes 210a, 210b and the test object 150 during test measurements.

Figure 3A:
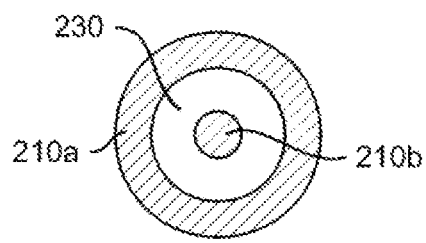
FIG. 3A is a diagram of illustrative concentric electrodes with an adjustment device in accordance with some embodiments.

The capacitive measuring apparatus of probe 100 may take any form that allows the measurement of a capacitance between electrodes 210. For example, the capacitive measuring apparatus may be made up of two concentric cylindrical electrodes 210a, 210b that are separated from each other by adjustment device 230 as shown in the FIG. 3A. In other words, electrode 210b may take the shape of a solid cylinder or a cylinder hull in the center of the capacitive measuring apparatus, while electrode 210a has the shape of a cylinder hull around electrode 210b. Since adjustment device 230 may adjust the spatial separation between electrodes 210a and 210b, electrode 210a may have a diameter that is adjustable based on the adjustments of adjustment device 230. Illustratively, and due to a selected viewing direction in FIG. 3A, however, electrode 210b is shown as a circle and electrode 210a as a ring.

Figure 3B:
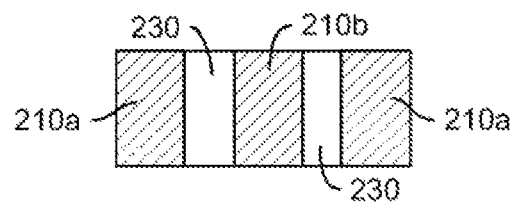
FIG. 3B is a diagram of illustrative parallel electrodes with an adjustment device in accordance with some embodiments.

As another example, each of electrodes 210 may take the shape of a solid cylinder, a cylinder hull, a tetraether, or any other shape or combination of shapes that are arranged parallel to each other. FIG. 3B shows such an arrangement in which the capacitive measurement apparatus includes parallel electrodes 210a, 210b, each in shape of a tetraether, and adjustment device 230 that adjusts the distance between the electrodes. Illustratively, and due to a selected viewing direction in FIG. 3B, however, electrodes 210a and 210b are shown as rectangles.

As shown, the capacitive measurement apparatus may include one electrode 210b and two electrodes 210a. The two electrodes 210a are connected to each other and arranged in parallel on both sides of electrode 210b. If desired, the capacitive measurement apparatus may include any other number of electrodes. For example, the capacitive measurement apparatus may include one electrode 210a and one electrode 210b, two electrodes 210a and 210b, two electrodes 210a and three electrodes 210b, etc. In other words, the capacitive measurement apparatus may include at least two electrodes 210 (i.e., one electrode 210a and one electrode 210b) or any other number of electrodes 210 greater than two. Preferably, the absolute number of the difference between electrodes 210a and 210b is smaller than or equal to one. Electrodes 210 are preferably arranged alternatingly to avoid the arrangement of two electrodes 210a next to each other or two electrodes 210b next to each other.

If desired, some or all electrodes 210a and/or 210b of the capacitive measurement apparatus may be surrounded by guard electrodes. The guard electrodes may receive the same electrical potential as the respective electrodes 210a and/or 210b. If desired, the guard electrodes may receive the electrical potential from a low impedance source. The guard electrodes may prevent that electric flux lines emanate from electrodes 210a and/or 210b in unwanted directions. Thus, guard electrodes may improve the sensitivity of the capacitive measurement apparatus, for example by increasing spatial resolution of detected imperfections.

Figure 4:
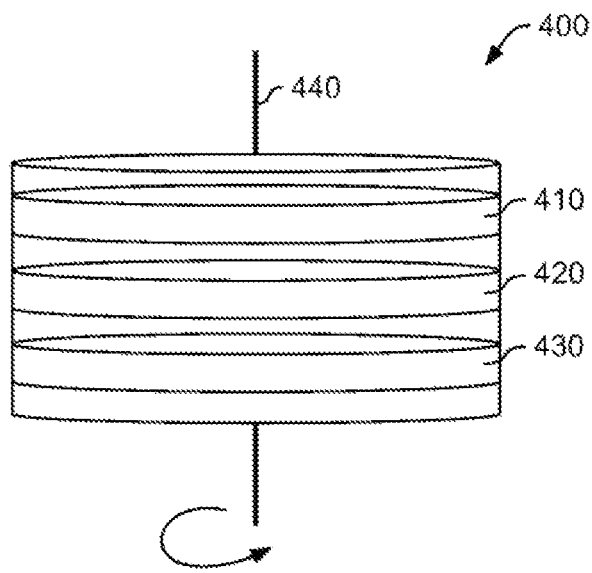
FIG. 4 is a diagram of an illustrative probe with parallel electrodes in form of disks for use on curved surfaces in accordance with some embodiments.

A diagram of an illustrative probe according to some embodiments is shown in FIG. 4. Probe 400 of FIG. 4 may include electrodes in the form of disks 410, 420, and 430 that are separated from each other by an adjustment device and mounted in parallel on a roller. Preferably, disks 410 and 430 are electrically connected to each other. If desired, probe 400 may include any other number of electrodes greater than or equal to two. If desired, an electrode may be electrically connected to every second-next other electrode. For example, consider the scenario in which the disks on the roller are numbered from 1 to N such that no even numbered disk is located next to another even numbered disk and no odd numbered disk is located next to another odd numbered disk. In this scenario, all odd numbered disks are preferably electrically connected with each other and all even numbered disks are preferably electrically connected with each other.

According to some embodiments, spring-loaded carbon and/or metallic contacts may electrically couple disks 410, 420, and 430 to roller 440. In other embodiments, the circuitry that performs the measurements and/or analyzes the results may be located inside the respective disks. If desired, the outer rims of the disks may include a separation device. During capacitance measurements, such a probe 400 with a separation device may be rolled over the test object around an axis that is defined by the roller. Rolling probe 400 over the test object may ensure a substantially constant distance between the electrodes and the test object, even on curved surfaces.

According to some embodiments, the separation device may include a coating of the electrodes. Such a coating may be provided on the outer rims of disks 410, 420, and 430 of FIG. 4 or on electrodes 210 of FIGS. 3A and 3B. An example of a probe with a separation device that includes a coating on the electrodes is shown in FIG. 5.

Figure 5:
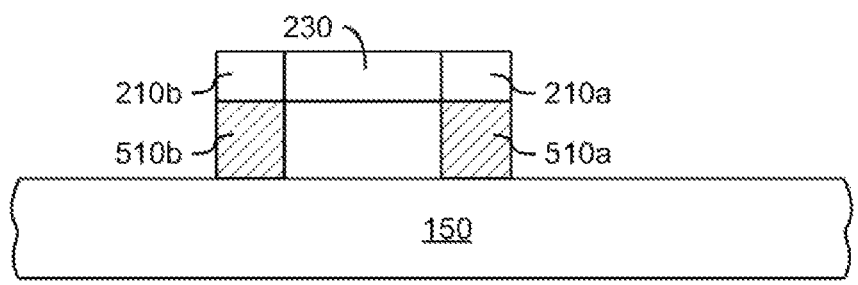
FIG. 5 is a diagram of an illustrative probe with a separation device that uses coatings in accordance with some embodiments.

The probe shown in FIG. 5 may include electrodes 210a and 210b, adjustment device 230, and a separation device that includes coatings 510a and 510b, collectively also referred to as coating 510. Adjustment device 230 may adjust the distance between electrodes 210a and 210b. The separation device may control a predetermined distance between the electrodes 210 and test object 150, whereby coating 510a controls the distance between electrode 210a and test object 150, and coating 510b controls the distance between electrode 210b and test object 150.

Preferably, coating 510 is electrically insulating and/or impervious to water and/or combines high resistivity with strength. For example, coating 510 may include parylene and/or polytetrafluoroethylene.

Figure 6:
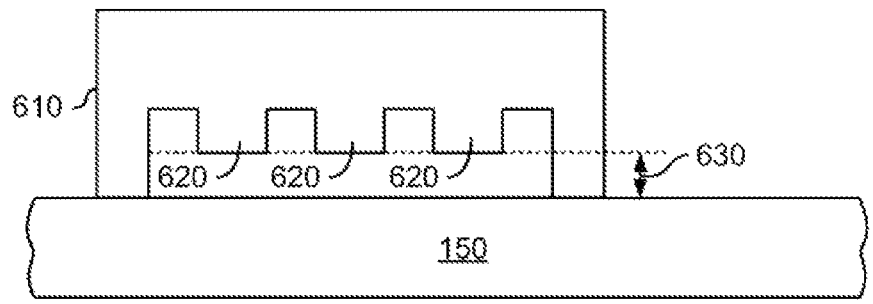
FIG. 6 is a diagram of an illustrative probe with a separation device that uses a well formed by an insulating substrate in accordance with some embodiments.

FIG. 6 is a diagram of an illustrative probe with a different separation device than the separation device shown in FIG. 5. As shown in FIG. 6, the probe may include insulating substrate 610 that may form a well. The well may accommodate electrodes 620 and serve as a separation device that maintains a predetermined distance 630 between electrodes 620 and test object 150.

Figure 7:
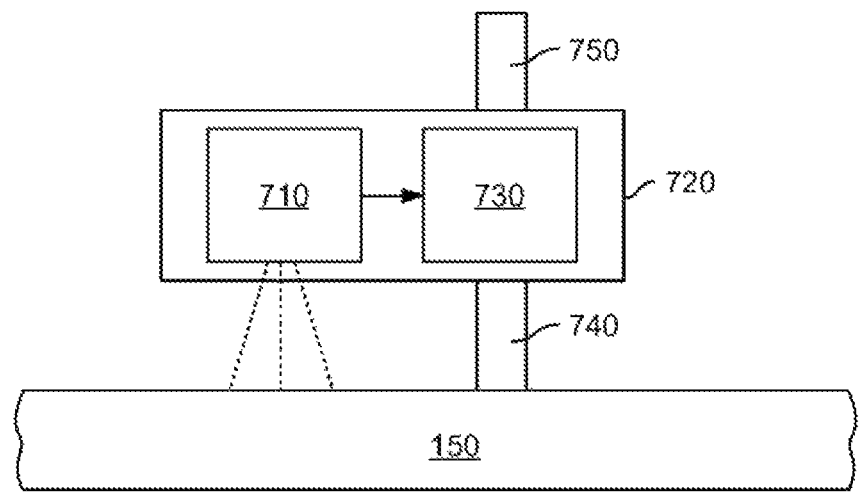
FIG. 7 is a diagram of an illustrative distance adjustment apparatus with control unit and actuators in accordance with some embodiments.

FIG. 7 is a diagram of an illustrative probe with a different separation device than the separation devices shown in FIGS. 5 and 6. As shown, the probe may include separation device 720, which may include distance measurement apparatus 710, and a distance adjustment apparatus that includes control unit 730 and actuators 740 and/or 750.

Distance measurement apparatus 710 may measure a distance between the electrodes and test object 150. If desired, distance measurement apparatus 710 may include a device based on an optical and/or an acoustical interference method. For example, distance measurement apparatus 710 may use a technique based on interferometry (e.g., a Michelson-Morley Interferometer), a method that exploits a geometrical relationship between the test object and the optical detection system (e.g., techniques based on depth from defocus, active triangulation, passive triangulation, etc.), short-range radar, and/or echolocation, just to name a few.

Distance measurement apparatus 710 may send information about the current distance between the electrodes and test object 150 to control unit 730. Control unit 730 may compare the current distance with a predetermined distance between electrodes and test object 150. Based on the comparison of the current distance with the predetermined distance, control unit 730 may direct actuators 740 and/or 750 to adjust the current distance. For example, in response to detecting that the current distance is smaller than the predetermined distance, control unit 730 may direct actuators 740 and/or 750 to increase the current distance between the electrodes and test object 150. As another example, in response to detecting that the current distance is greater than the predetermined distance, control unit 730 may direct actuators 740 and/or 750 to reduce the current distance between the electrodes and test object 150. Actuators 740 and/or 750 may include a robot arm, a telescopic arm, or any other device that is controllable by control unit 730 and enables the adjustment of the distance between the electrodes and the test object.

According to one aspect, the separation device may include two pairs of electrodes that are arranged at two different predetermined distances from the test object. The separation device may electrically switch between the two pairs of electrodes rather than mechanically varying the predetermined distance between the electrodes and the test object. If desired, the probe may include a separation device that uses more than one technique to ensure a substantially constant distance between the electrodes and the test object. For example, the probe may include a separation device that uses a combination of two or more of the techniques used in the separation devices shown in FIGS. 5, 6, and/or 7.

Consider the scenario in which two parallel electrodes (e.g., electrodes 210 of FIG. 2 or 5) are positioned in the same plane parallel to the surface of the test object at a predetermined distance from the test object as controlled by a separation device. Consider further that an adjustment device (e.g., adjustment device 230 of FIG. 2 or 5) controls the separation distance between the electrodes.

As an example, consider further that the probe is used to detect imperfections in metals (e.g., corrosion), which may be regarded as an undesired variation in metal thickness. In this example, the probe measures a change in capacitance as the electrodes move in the x and y direction (i.e., parallel to the surface of the test object), and as the separation device varies the predetermined separation (i.e., moves the electrodes in the z direction) of the electrodes from the test object. The probe may determine the real and imaginary parts of the dielectric constants according to equations (1) to (6) at the different positions and compare the results with reference results obtained from performing the same measurements using a reference test object that is free from imperfections. Based on the comparison of the measured results with the reference results, an imperfection such as a change in the metal thickness may be detected.

As another example, consider further that the probe is used to detect imperfections in non-conducting materials. In this example, the probe measures a change in capacitance as the electrodes move in the x and y direction (i.e., parallel to the surface of the test object). The adjustment device may accurately control the separation distance between the electrodes, thereby determining the depth of interrogation into the test object. In some embodiments and for some test objects, the depth of penetration T and the distance between the electrodes D may have a linear relationship (e.g., T=1.35 D). Thus, the separation distance between the electrodes may provide the ability to measure an effective dielectric constant at a predetermined depth within the test object. As a result, the probe may not only detect the presence of an imperfection, but also the location of the imperfection in terms of position and depth (i.e., the three-dimensional location in x, y, and z direction).

If desired, the probe may determine the shape of the imperfection. For example, upon detection of an imperfection, the probe may repeatedly postulate a shape which transforms the obtained capacitance measurements until a match is found. The match may determine the depth of penetration.

The measured relative dielectric constant for a host material containing imperfections (i.e., the test object) in the x direction may be defined as $$\epsilon\text{eff}=\epsilon+f\epsilon((\epsilon i-\epsilon)/(\epsilon+(1-f)N_x(\epsilon i-\epsilon))) \tag{7}$$

where $\epsilon$ is the dielectric constant for the host material, $\epsilon i$ is the dielectric constant for the imperfection (e.g., for an air bubble $\epsilon i=1$ and for water $\epsilon i=80$), f is the volume fraction of the imperfections, and N represents the polarisation factors in x, y, and z direction (i.e., $N_x$, $N_y$, and $N_z$). For a spherical inclusion, the polarisation factors are $N_x=N_y=N_z=\frac{1}{3}$, for a disc $N_x=1$, $N_y=N_z=0$, for a needle with circular cross section $N_x=0$, $N_y=N_z=\frac{1}{2}$. Furthermore, for spheroids with eccentricity e and length scales $a_x$, $a_y$, and $a_z$ such as for prolate spheroids with $a_x>a_y=a_z$ the polarization factors are $$N_x = \frac{1-e^2}{2e^3}\left(\ln\left(\frac{1+e}{1-e}\right)-2e\right) \tag{8}$$

and for oblate spheroids ($a_x=a_y>a_z$)

$$N_z = \frac{1+e^2}{e^3}(e-\tan^{-1}e) \tag{9}$$

and $N_x=N_y=\frac{1}{2}(1-N_z)$, where $$e = \sqrt{\left(\frac{a_x}{a_z}\right)^2 - 1}$$

It should be noted that high contrast may be achieved with water ($\epsilon=80$) and air bubbles ($\epsilon=1$) as most dielectric materials have $\epsilon$ values in the range 4-10. For carbon fiber based laminates the effective dielectric constant is a function of fiber content and frequency.

Figure 8:
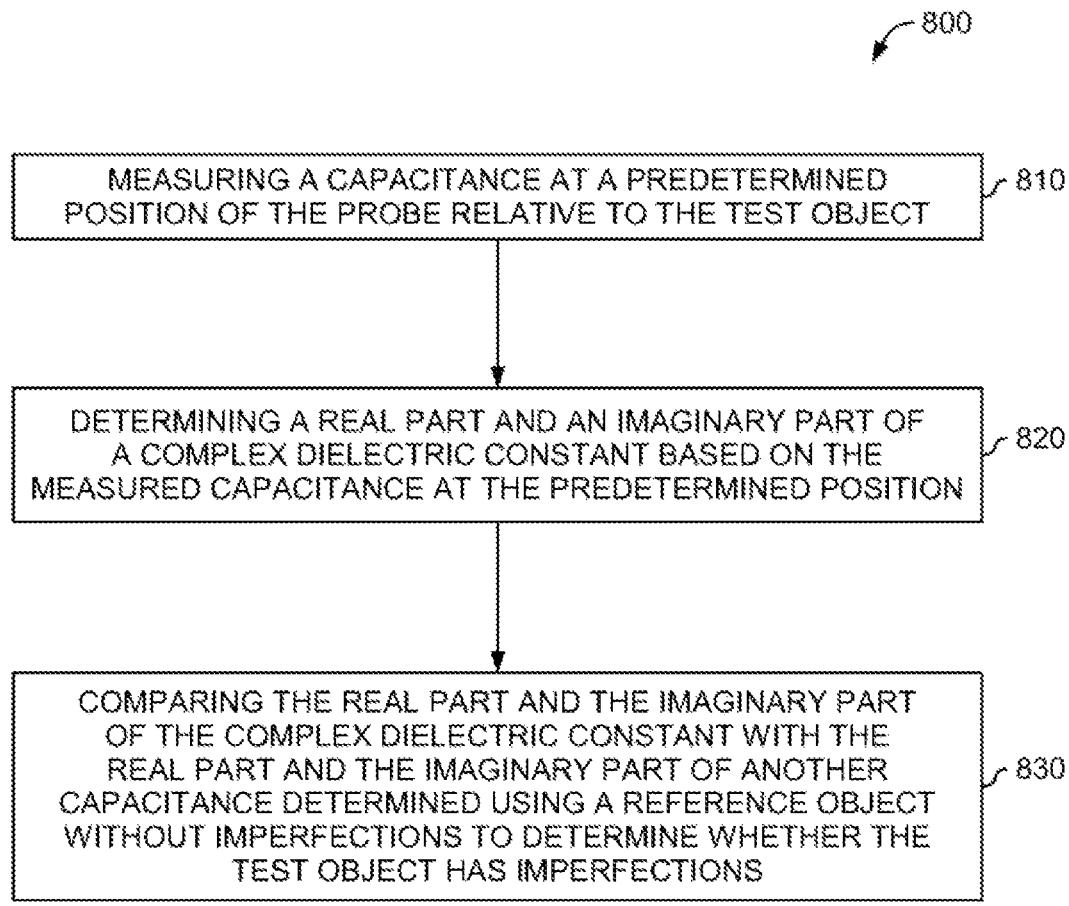
FIG. 8 is a diagram of a flowchart showing illustrative operations for non-intrusively detecting imperfections in a test object using a probe in accordance with some embodiments.

FIG. 8 is a diagram of a flowchart 800 showing illustrative operations for non-intrusively detecting imperfections in a test object using a probe in accordance with some embodiments.

During operation 810, the probe may measure a capacitance at a predetermined position of the probe relative to the test object. For example, probe 100 of FIG. 1, 2, 4, 5, or 6 may measure a capacitance using an embedded capacitance measurement apparatus having at least two coplanar electrodes, an adjustment device for adjusting a spatial separation between the at least two coplanar electrodes, and a separation device, wherein the separation device maintains a substantially constant distance between the at least two coplanar electrodes and the test object during test measurements.

During operation 820, the probe may determine a real part and an imaginary part of a complex dielectric constant based on the measured capacitance at the predetermined position. For example, the probe may measure the impedance of the capacitor and use equations (5) and (6) to determine a real part (i.e., $\epsilon 1(\omega)$) and an imaginary part (i.e., $\epsilon 2(\omega)$) of a complex dielectric constant.

During operation 830, the probe may compare the real part and the imaginary part of the complex dielectric constant with the real part and the imaginary part of another capacitance determined using a reference object without imperfections to determine whether the test object has imperfections. For example, the probe may retrieve the real part and the imaginary part of a reference capacitance determined using a reference object without imperfections from a database and compare the measured real and imaginary parts with the reference real and imaginary parts.

Figure 9:
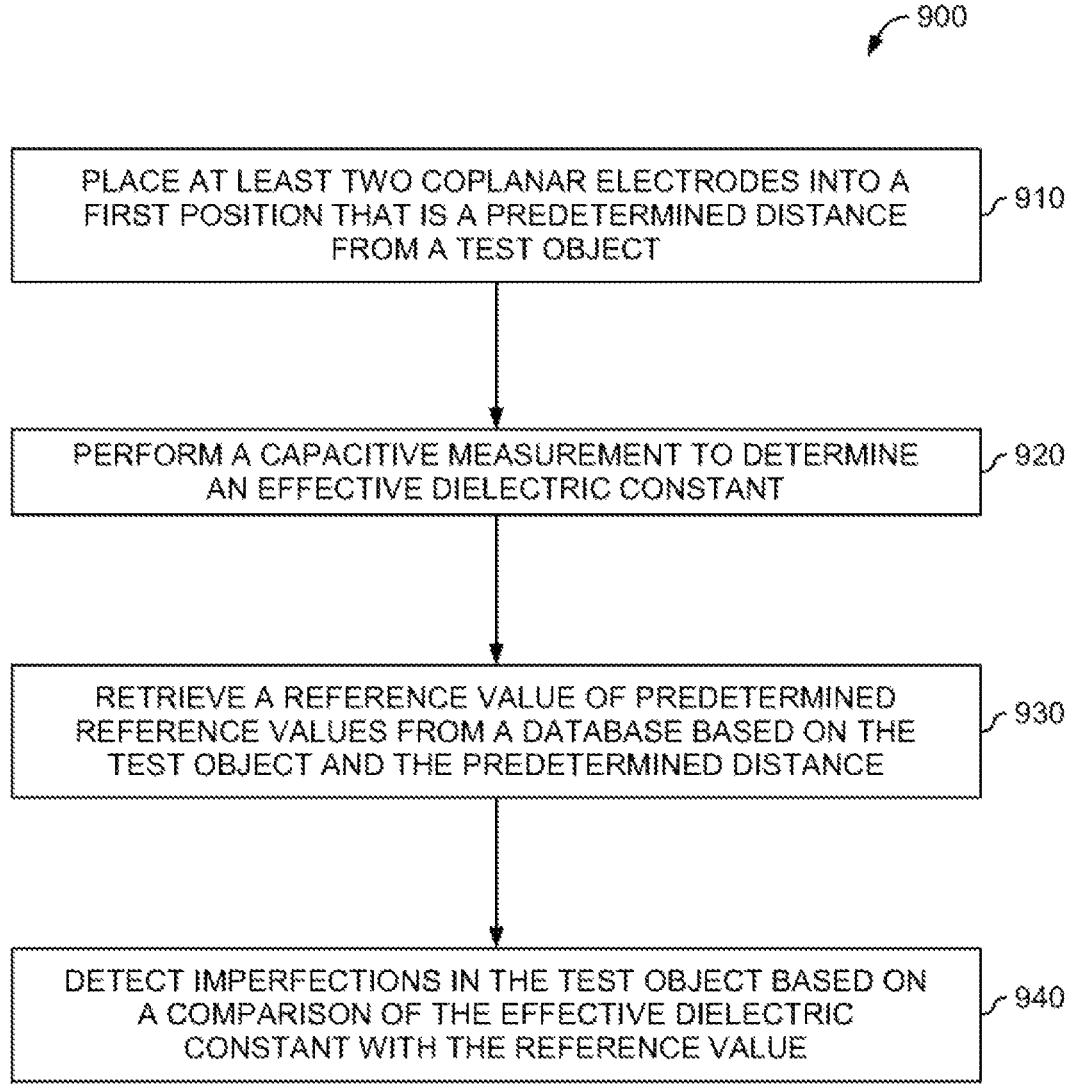
FIG. 9 is a diagram of a flowchart showing illustrative operations for detecting imperfections in a test object based on a comparison of the measured effective dielectric constant with a reference value in accordance with some embodiments.

FIG. 9 is a diagram of a flowchart 900 showing illustrative operations for detecting imperfections in a test object based on a comparison of the measured effective dielectric constant with a reference value in accordance with some embodiments.

During operation 910, a probe may place at least two coplanar electrodes into a first position that is at a predetermined distance from a test object. For example, probe 100 of FIG. 1, 2, 4, 5, or 6 may place the electrodes into a position $x_1, y_1, z_1$ relative to test object 150.

During operation 920, the probe may perform a capacitive measurement to determine an effective dielectric constant. For example, the probe may determine the effective dielectric constant according to equation (7).

During operation 930, the probe may retrieve a reference value of predetermined reference values from a database based on the test object and the predetermined distance.

During operation 940, the probe may detect imperfections in the test object based on a comparison of the effective dielectric constant with the reference value.

Figure 10:
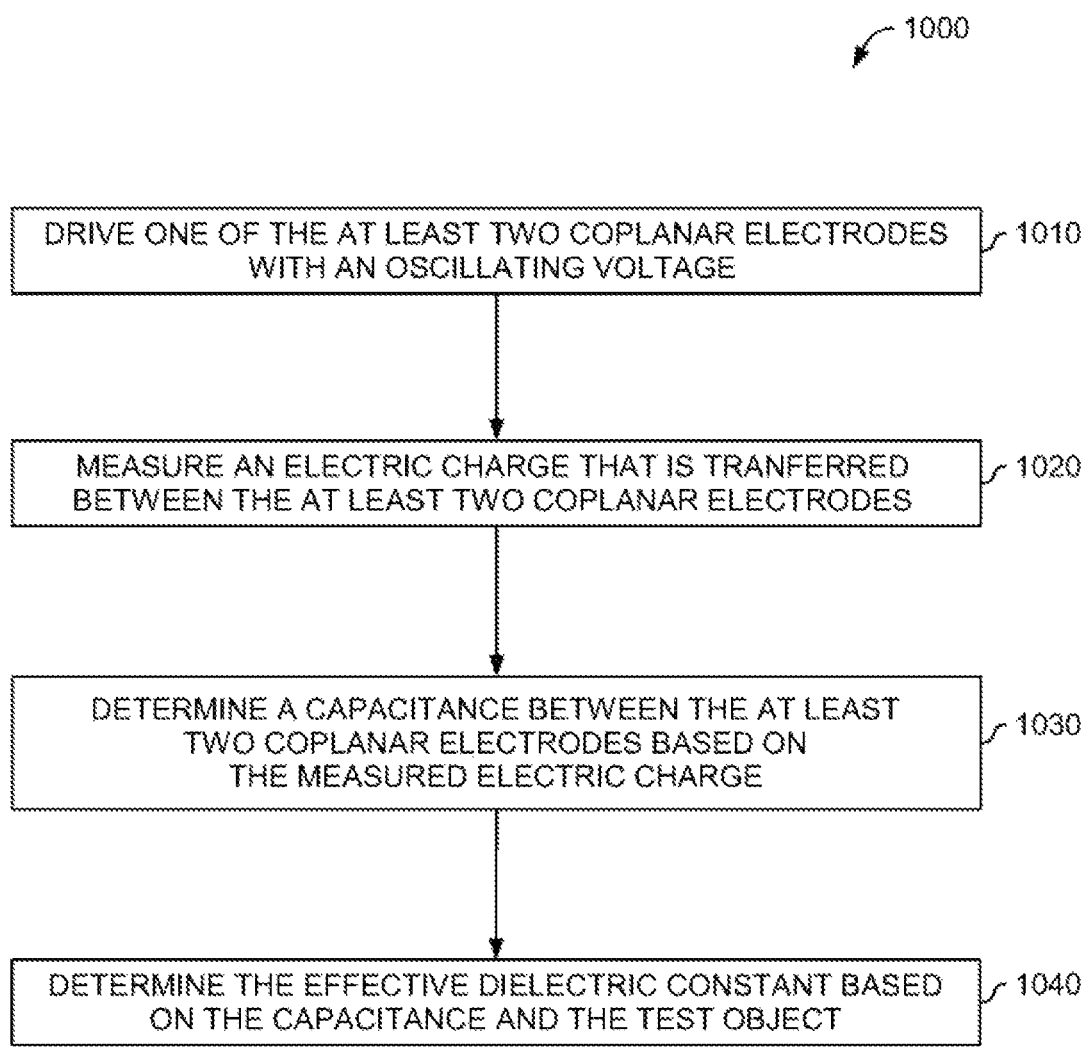
FIG. 10 is a diagram of a flowchart showing illustrative operations to determine the effective dielectric constant of a test object during a measurement in accordance with some embodiments.

FIG. 10 is a diagram of a flowchart 1000 showing illustrative operations to determine the effective dielectric constant of a test object during a measurement in accordance with some embodiments.

During operation 1010, a probe may drive one of the at least two coplanar electrodes with an oscillating voltage. For example, probe 100 of FIG. 1, 2, 4, 5, or 6 may drive one of the electrodes with an oscillating voltage V.

During operation 1020, the probe may measure an electric charge that is transferred between the at least two coplanar electrodes.

During operation 1030, the probe may determine a capacitance between the at least two coplanar electrodes based on the measured electric charge. For example, the probe may determine the capacitance as a function of the electric charge and the oscillating voltage.

During operation 1040, the probe may determine the effective dielectric constant based on the capacitance and the test object. For example, the probe may use equation (7) to determine the effective dielectric constant.

Figure 11:
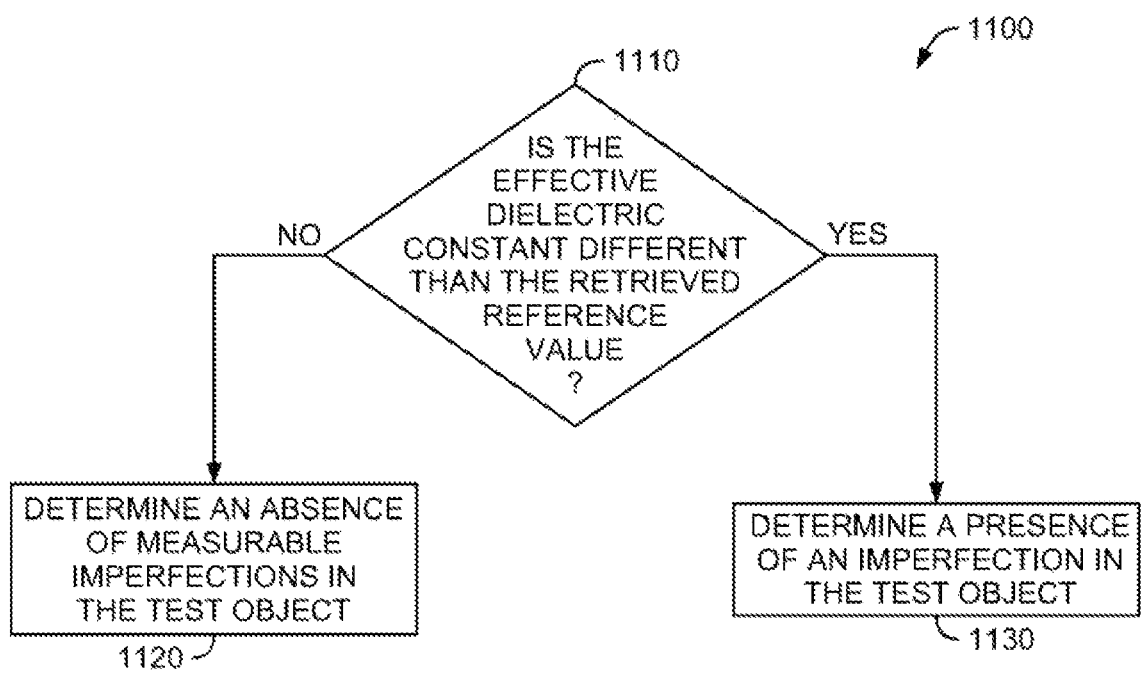
FIG. 11 is a diagram of a flowchart showing illustrative operations to determine the presence or the absence of an imperfection in a test object in accordance with some embodiments.

FIG. 11 is a diagram of a flowchart 1100 showing illustrative operations to determine the presence or the absence of an imperfection in a test object in accordance with some embodiments.

During operation 1110, a probe may verify whether the effective dielectric constant is different than the retrieved reference value.

During operation 1120, in response to determining that the effective dielectric constant is not different than the retrieved reference value, the probe may determine an absence of measurable imperfections in the test object.

During operation 1130, in response to determining that the effective dielectric constant is different than the retrieved reference value, the probe may determine a presence of an imperfection in the test object.

Figure 12:
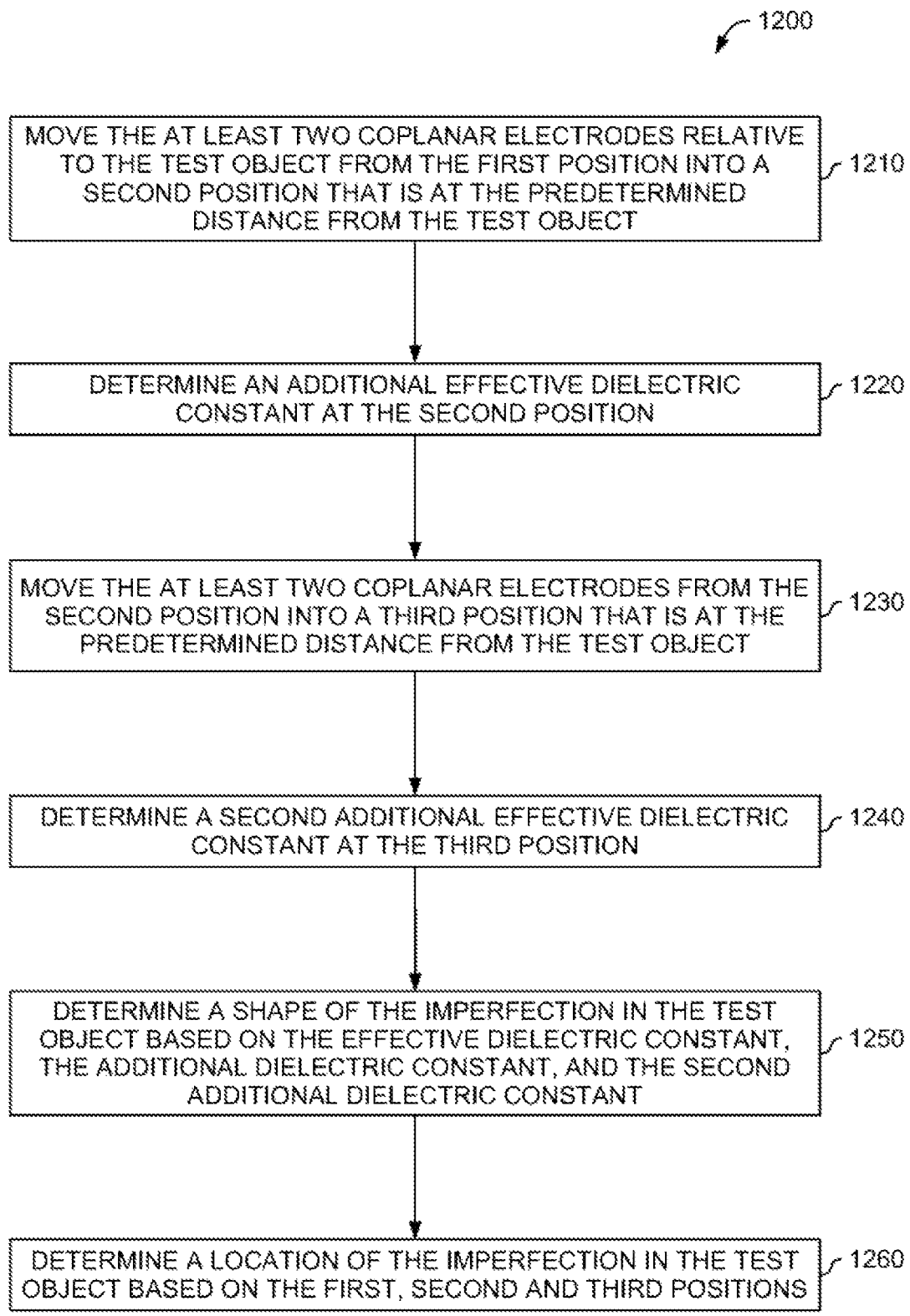
FIG. 12 is a diagram of a flowchart showing illustrative operations for determining a shape and a location of a detected imperfection in accordance with some embodiments.

FIG. 12 is a diagram of a flowchart 1200 showing illustrative operations for determining a shape and a location of a detected imperfection in accordance with some embodiments.

During operation 1210, a probe may move the at least two coplanar electrodes relative to the test object from the first position into a second position that is at the predetermined distance from the test object. For example, probe 100 of FIG. 1, 2, 4, 5, or 6 may move the electrodes from position x1, y1, z1 relative to test object 150 to position x2, y2, z1.

During operation 1220, the probe may determine an additional effective dielectric constant at the second position.

During operation 1230, the probe may move the at least two coplanar electrodes from the second position into a third position that is at the predetermined distance from the test object.

During operation 1240, the probe may determine a second additional effective dielectric constant at the third position.

During operation 1250, the probe may determine a shape of the imperfection in the test object based on the effective dielectric constant, the additional dielectric constant, and the second additional dielectric constant.

During operation 1260, the probe may determine a location of the imperfection in the test object based on the first, second, and third positions.

Figure 13:
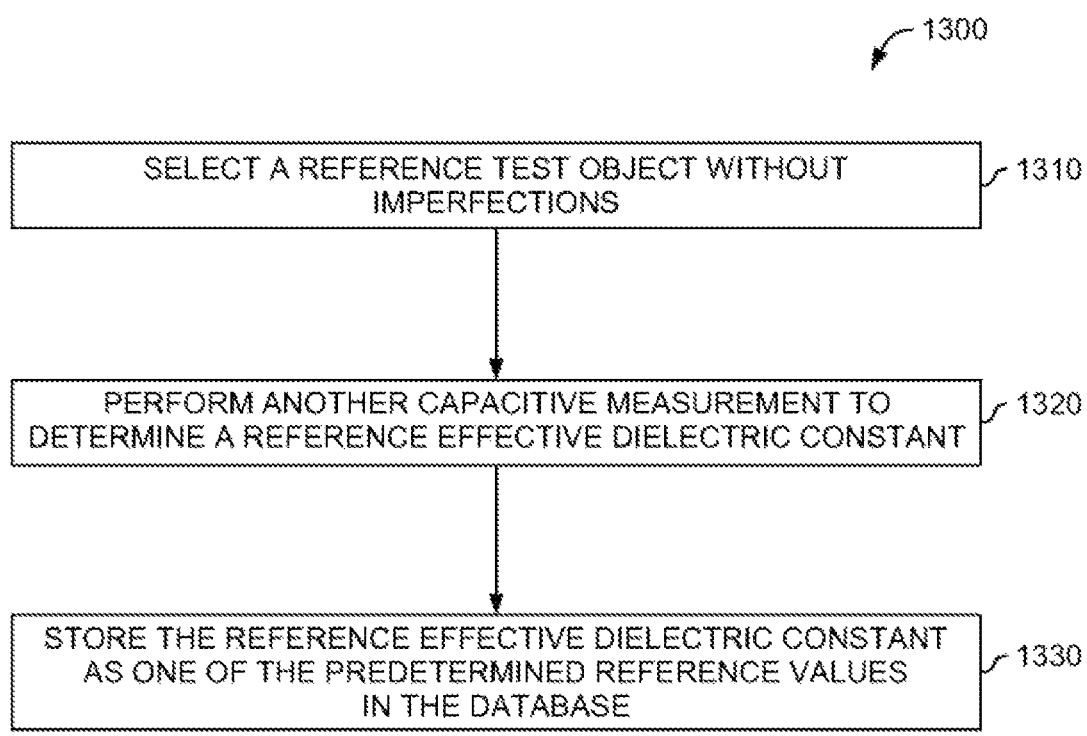
FIG. 13 is a diagram of a flowchart showing illustrative operations for building a database with reference effective dielectric constants by performing capacitive measurements on reference test objects without imperfections in accordance with some embodiments.

FIG. 13 is a diagram of a flowchart 1300 showing illustrative operations for building a database with reference effective dielectric constants by performing capacitive measurements on reference test objects without imperfections in accordance with some embodiments.

During operation 1310, a user may select a reference test object without defects.

During operation 1320, the user may perform another capacitive measurement to determine a reference effective dielectric constant.

During operation 1330, the user may store the reference effective dielectric constant as one of the predetermined reference values in the database.

It should be noted that the above described embodiments are merely described to illustrate possible realizations of the present invention, but not in order to restrict the present invention thereto. Instead, multiple modifications and variations of the invention are possible and should, therefore, also be considered as being part of the invention.

By way of example, the insulating substrate 610 of FIG. 6 may have the shape of one or more disks that is arranged on the roller parallel to disks 410, 420, and 430 of FIG. 4 and forms an insulating well using separation device 630. Moreover, the separation device of FIG. 7 may be used within any probe of FIG. 1, 2, 4, 5, or 6. Furthermore, the adjustment device may include movable devices on which the electrodes are mounted.

REFERENCE LIST

100 probe
150 test object
210*a*, 210*b* electrodes
220 separation device
230 adjustment device
400 probe
410 disk
420 disk
430 disk
440 roller
510*a*, 510*b* coatings
610 insulating substrate
620 electrodes
630 separation device
710 distance measurement apparatus
720 separation device
730, 740, 750 distance adjustment apparatus with control unit and actuators
800 flowchart
810, 820, 830 method steps
900 flowchart
910, 920, 930, 940 method steps
1000 flowchart
1010, 1020, 1030, 1040 method steps
1100 flowchart
1110, 1120, 1130 method steps
1200 flowchart
1210, 1220, 1230, 1240, 1250, 1260 method steps 1300 flowchart
1310, 1320, 1330 method steps

What is claimed is:

1. A probe for non-intrusively detecting imperfections in a test object made from metallic, non-conductive, and/or composite materials, the probe comprising a capacitive measuring apparatus comprising at least two coplanar electrodes, wherein the capacitive measuring apparatus is adapted to measure a capacitance between the at least two coplanar electrodes at a predetermined position of the probe relative to the test object; a separator adapted to maintain a substantially constant distance between the at least two coplanar electrodes and the test object during test measurements; and an adjustor adapted to adjust a spatial separation between the at least two coplanar electrodes.

2. The probe of claim 1, further comprising at least two disks for non-intrusively detecting imperfections in test objects with a curved surface, wherein respective disks of the at least two disks form respective ones of the at least two coplanar electrodes.

3. The probe of claim 2, wherein the at least two disks are mounted parallel to each other on a roller.

4. The probe of claim 3, further comprising a spring-loaded contact that electrically couples a power source through the roller with at least one of the at least two disks.

5. The probe of claim 1, wherein the separator comprises a coating of the at least two coplanar electrodes.

6. The probe of claim 5, wherein the coating is electrically insulating.

7. The probe of claim 5, wherein the coating is impervious to water.

8. The probe of claim 5, wherein the coating comprises at least one of parylene or polytetrafluoroethylene.

9. The probe of claim 8, wherein the insulating substrate forms a well that accommodates the at least two coplanar electrodes.

10. The probe of claim 1, wherein the separator comprises an insulating substrate.

11. The probe of claim 1, wherein the separator further comprises a distance measurement apparatus for measuring a distance between the at least two coplanar electrodes and the test object.

12. The probe of claim 11, wherein the distance measurement apparatus comprises a device based at least on one of an optical or an acoustical interference method.

13. The probe of claim 11, wherein the separator further comprises a distance adjustment apparatus for adjusting the substantially constant distance between the at least two coplanar electrodes and the test object based on the distance measured between the at least two coplanar electrodes and the test object with the distance measurement apparatus.

14. A method for non-intrusively detecting imperfections in a test object using a probe for non-intrusively detecting imperfections in a test object made from metallic, non-conductive, and/or composite materials, the probe comprising a capacitive measuring apparatus, characterized in that the capacitive measuring apparatus comprises at least two coplanar electrodes, wherein a substantially constant distance is maintained between the at least two coplanar electrodes and the test object during test measurements, the method comprising the steps of measuring a capacitance at a predetermined position of the probe relative to the test object, determining a real part and an imaginary part of a complex dielectric constant based on the measured capacitance at the predetermined position, and comparing the real part and the imaginary part of the complex dielectric constant with the real part and the imaginary part of another complex dielectric constant determined using a reference object without imperfections to determine whether the test object has imperfections.

15. The method of claim 14, wherein the probe further comprises at least two disks that form respective ones of the at least two coplanar electrodes and that are mounted parallel to each other on a roller, and wherein the step of measuring the capacitance at the predetermined position of the probe relative to the test object further comprises:
using the roller to roll the probe over the test object.

16. The method of claim 14, wherein a separator is provided to maintain the substantially constant distance between the at least two coplanar electrodes and the test object during test measurements, the separator comprising a distance measurement apparatus for measuring a distance between the at least two coplanar electrodes and the test object, and wherein the step of measuring the capacitance at the predetermined position of the probe relative to the test object further comprises:
using the distance measurement apparatus to measure the distance between the at least two coplanar electrodes and the test object.

17. The method of claim 16, wherein the separator further comprises a distance adjustment apparatus for adjusting the substantially constant distance between the at least two coplanar electrodes and the test object, and wherein the step of measuring the capacitance at the predetermined position of the probe relative to the test object further comprises:
using the distance adjustment apparatus to adjust the substantially constant distance between the at least two coplanar electrodes and the test object.

18. A probe, comprising a capacitive measuring apparatus that comprises at least two coplanar electrodes that are adapted for being applied to a test object made from metallic, non-conductive, and/or composite materials from one side only for measuring a capacitance at a predetermined position of the probe relative to the test object for non-intrusively detecting imperfections in the test object; and an adjustor adapted to adjust a spatial separation between the at least two coplanar electrodes.

19. The probe of claim 18, further comprising:
a separator that maintains a substantially constant distance between the at least two coplanar electrodes and the test object during test measurements.

20. The probe of claim 19, wherein the separator comprises a separation device comprising a coating of the at least two coplanar electrodes, and the adjustor comprises an adjustment device.

* * * * *